United States Patent [19]

Kobayashi et al.

[11] 4,444,635
[45] Apr. 24, 1984

[54] FILM FORMING METHOD

[75] Inventors: Shigeru Kobayashi, Tokyo; Nobuo Nakagawa, Yokohama; Katsuo Abe, Yokosuka; Tsuneaki Kamei, Kanagawa; Kazuyuki Fujimoto, Tokyo, all of Japan

[73] Assignee: Hitachi, Ltd., Tokyo, Japan

[21] Appl. No.: 400,258

[22] Filed: Jul. 21, 1982

[30] Foreign Application Priority Data

Jul. 22, 1981 [JP] Japan ................................ 56-113660
May 17, 1982 [JP] Japan ................................ 57-81457

[51] Int. Cl.³ ............................................. C23C 15/00
[52] U.S. Cl. ................................. 204/192 R; 204/298
[58] Field of Search .................................. 204/192 R

[56] References Cited

U.S. PATENT DOCUMENTS

| 3,956,093 | 5/1976 | McLeod | 204/192 R |
| 4,025,410 | 5/1977 | Stewart | 204/192 R |
| 4,132,613 | 1/1979 | Penfold et al. | 204/192 R |
| 4,155,825 | 5/1979 | Fournier | 204/192 R |
| 4,265,729 | 5/1981 | Morrison | 204/192 R |
| 4,309,266 | 1/1982 | Nakamura et al. | 204/192 R |
| 4,356,073 | 10/1982 | McKelvey | 204/192 R |

OTHER PUBLICATIONS

Abe, et al., Thin Solid Films, 96(1982), pp. 225-233.
Hoffman, Thin Solid Films, 96(1982), pp. 217-224.

*Primary Examiner*—Arthur P. Demers
*Attorney, Agent, or Firm*—Antonelli, Terry & Wands

[57] ABSTRACT

A film forming method by plasma sputtering is provided to attain a composite film on a substrate. A target plate having metal materials in a different pattern is prepared in opposition to the substrate. A plasma is created by a planar magnetron sputtering electrode structure. The plasma is shifted magnetically on the target plate by at least three magnetically coupled magnetic poles to deposit the materials into a film with a uniform thickness and a desired composition on the substrate.

16 Claims, 24 Drawing Figures

FIG.2
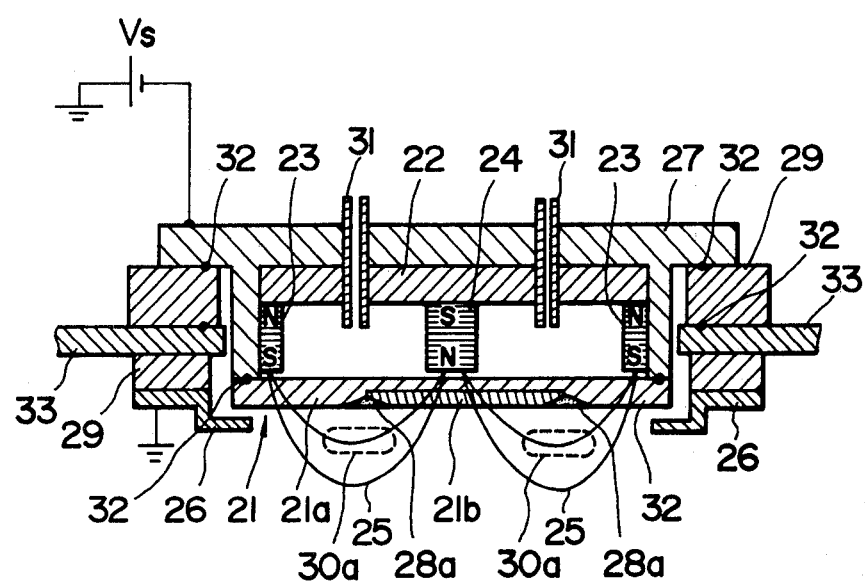
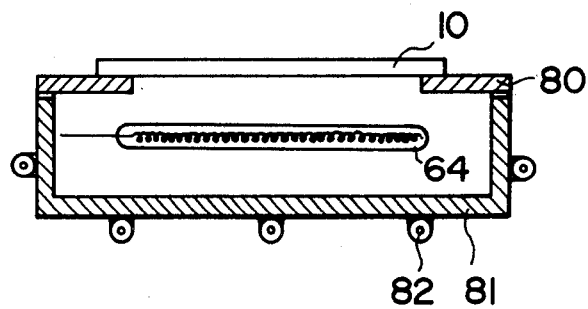

FIG.3
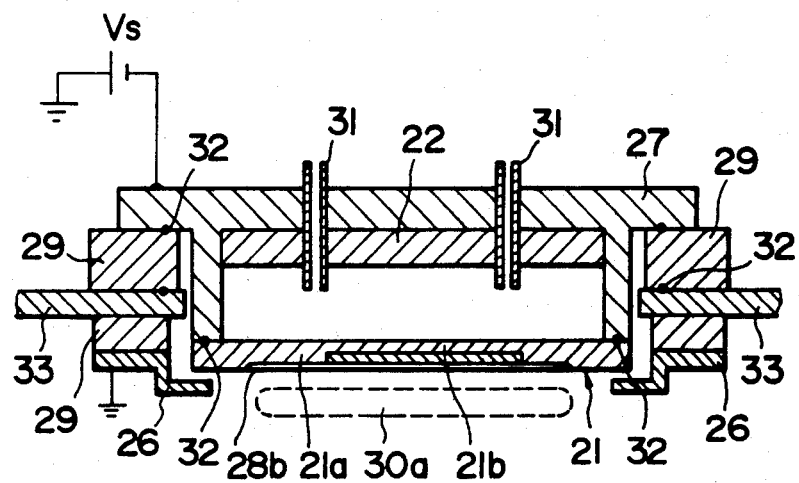
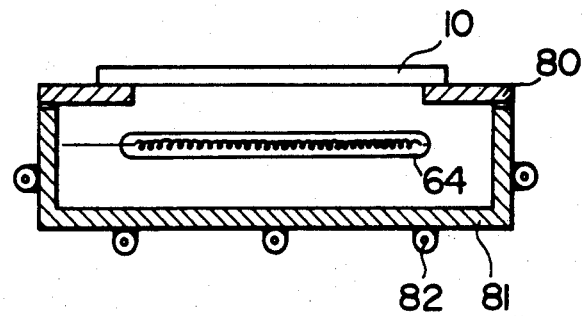

FIG.4
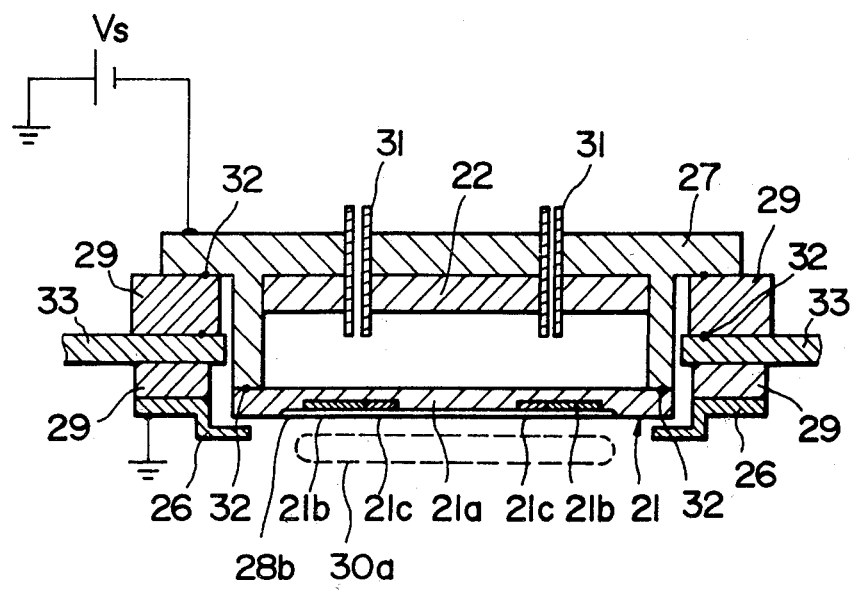
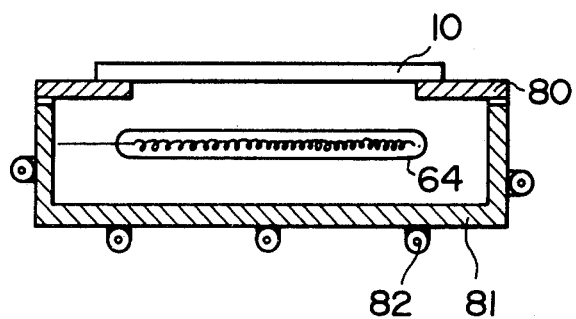

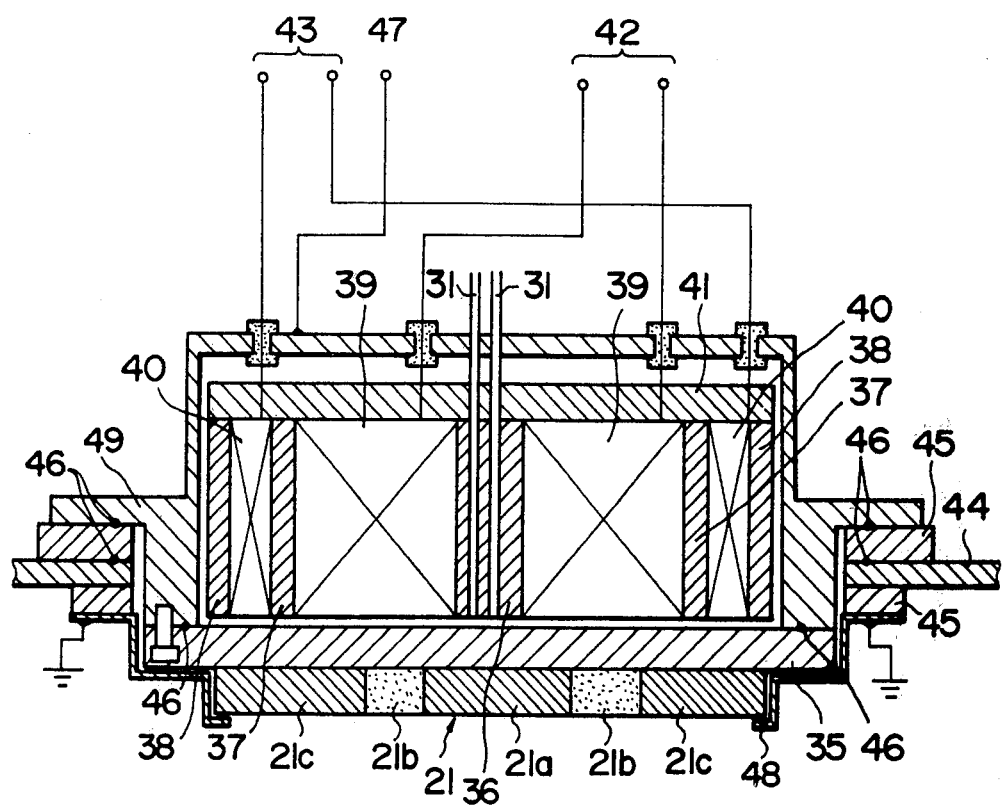
FIG.5
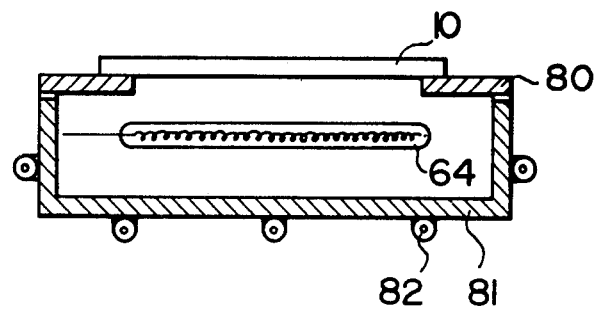

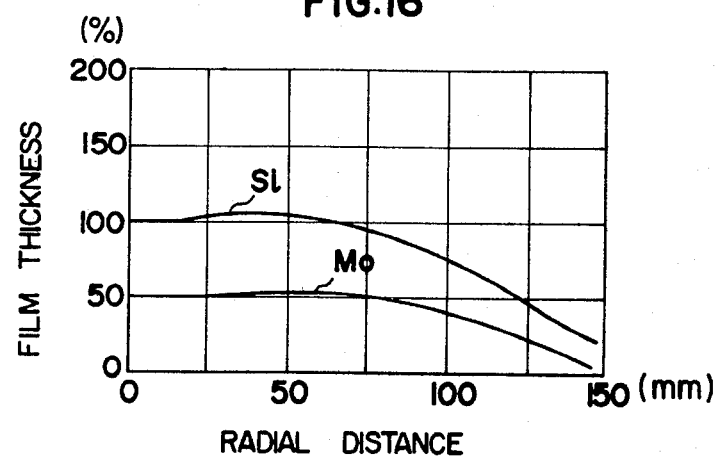
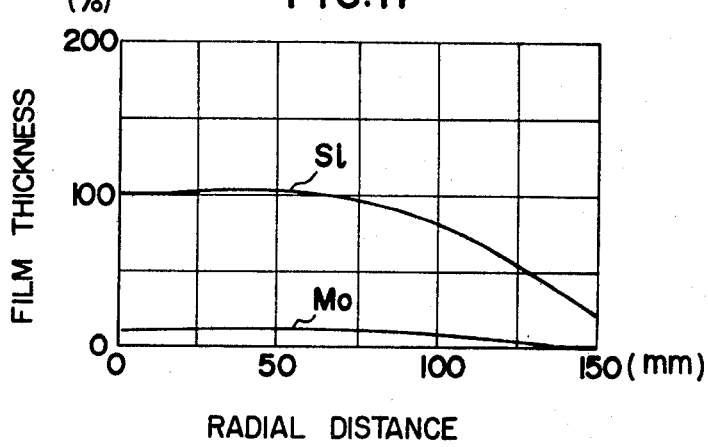

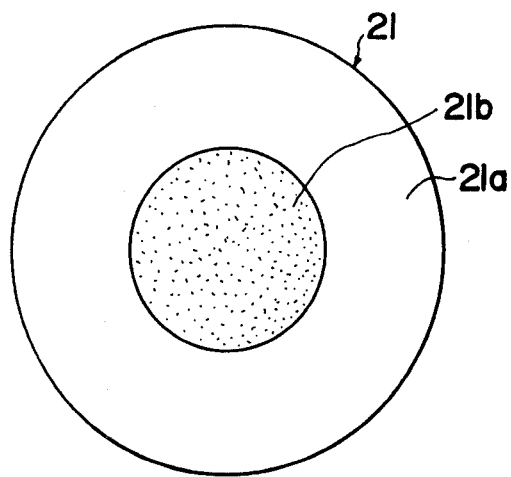
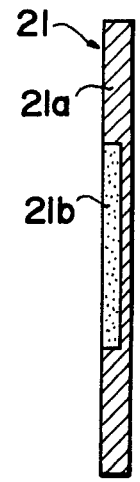
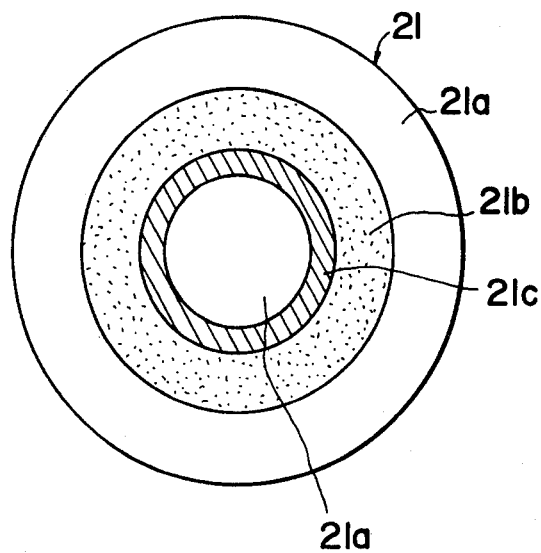
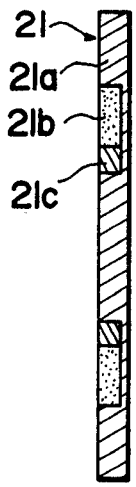

FILM FORMING METHOD

The present invention relates to a film forming method for forming a composite film such as a silicon alloy film on a substrate by the sputtering technique.

In the sputtering technique, a low-pressure gas, e.g. argon, in a space is ionized by glow discharge to form a plasma, and ions in the plasma are accelerated by an electric field generated by a voltage applied between a cathode and an anode to bombard a planar target plate placed on the cathode. Atoms or particles sputtered from the target plate by the bonbardment of ions are successively deposited on a substrate placed in the vicinity of the anode to form a thin film of a target material.

In this case, in order to assure good qualities for the film deposited on the substrate, to improve the rate of deposition, and to lower the damage to the substrate by electrons, it is important to confine ions and electrons generated by glow discharge in a limited space to a high density, and to effectively transfer the ions in the limited space to the planar target plate.

Therefore, various magnetic field configurations have been studied which can confine the ions in a limited space above the planar target plate obtain high ion and electron densities.

In recent years, a planar magnetron sputtering apparatus has attained nearly equal deposition rate to that of a conventional resistance heating type vacuum evaporation apparatus, and therefore is widely used in a film forming process for mass production of thin films for use in thin film integrated circuits and semiconductor devices. A recent technical trend of planar magnetron sputtering apparatuses is described in, for example, an article by Waits entitled "Planar magnetron sputtering", J. Vac. Soc. Tachnol., 15 (2), March/April, 1978, pp. 179 to 187.

FIG. 1 shows a conceptual chart for illustrating a prior art device for depositing a mixture of a plurality of different materials on the substrate by a plurality sputtering electrode structures and a film forming method therefor. For the purpose of simplicity of illustration and description, the deposition of two film forming materials A and B is explained. Sputtering sources 2A and 2B are spaced by a predetermined distance. The sputtering sources 2A and 2B comprise magnetic flux generating means 4A and 4B mounted on back sides of target material plates 1A and 1B, which are electrically connected with high voltage power supplies $V_A$ and $V_B$ for applying high voltages across target material plates 1A and 1B and the anodes 6A and 6B, respectively. Magnetic fields are generated by the magnetic flux generating means 4A and 4B in a space above the target plates 1A and 1B to confine therein plasmas at a high density. The ions in the plasmas are accelerated by an electric field which is created by the high voltages applied by the high voltage power supplies $V_A$ and $V_B$ across the target plates 1A and 1B and the anodes, 2A and 2B, respectively. The electric field is substantially normal to the surfaces of the target plates 1A and 1B the ions are accelerated by the electric field and they bombard the surfaces of the target plates 1A and 1B. As a result, atoms or particles are sputtered out of the surfaces of the target plates 1A and 1B. FIG. 1 illustrates a concept of the prior art called a co-sputtering technique. Vacuum means and sputter gas introducing means necessary for the sputtering device are not shown therein. By the same reason, a detailed structure of vacuum seals of the sputter electrodes is also not shown. Numeral 12 denotes a heater to heat the substrates 10 which are fixed on planetary-rotating substrate fixtures 11A and 11B, and 2A and 2B denote planar magnetron type sputtering electrode bodies for sputtering the materials A and B, respectively, and the sputtering electrode bodies have the target plates 1A and 1B made of the materials A and B, respectively. The target plates 1A and 1B, and the substrate fixtures 11A and 11B are spaced by a predetermined distance.

In order to allow substrates 10 on planetary rotating substrate fixtures 11A and 11B to be uniformly covered by the sputtered materials A and B from the sources 2A and 2B to form the composite film, the substrates 10 must be fixed and the planetary-rotating substrate fixtures 11A and 11B mounted above the sputtering sources 2A and 2B which must be revolved around their axes. A composition of the composite film formed on the substrates 10 can be varied by controlling a ratio of sputtering electric powers fed by the sputtering power supplies $V_A$ and $V_B$ to the sputtering sources 2A and 2B. However, in the prior art co-sputtering technique, loading the substrates 10 on the planetary-rotating substrate fixtures 11A and 11B is complex and difficult to be automized, and hence it must be relied on a manual work. In addition, it is necessary to rotate the substrate fixtures as well as substrates relative to the sputtering sources for many times during the film formation and a high quality of composite film are sometimes unable to be formed because of the creation of dusts due to the movements of the substrate fixtures. The introduction of movements into the vacuum device and the movements of the mechanical system in the vacuum chamber tend to increase the complexity of the sputtering machine, and hence decrease the reliability of the sputtering machine.

In the prior art co-sputtering technique, since the plurality of substrates 10 mounted on the planetary-rotating substrate fixtures 11A and 11B are usually spaced from the sputtering sources 2A and 2B by approximately 150–500 mm, the film formation rate which each substrate is subjected results to be low so that more residual gas which is not evacuated by the vacuum means tends to be contained in the film during the film formation and hence a desired high quality of composite film is not attained. This has been a great neck in the manufacturing process.

It is an object of the present invention to provide a film forming method which allows the formation of a high quality of composite film on a substrate surface by the sputtering technique.

In order to achieve the above object, in accordance with the present invention, a target plate having different materials placed thereon is prepared and a plasma is generated at the target plate by a planar magnetron type sputtering electrode structure and the position of the generated plasma is magnetically shifted to form the composite film with a predetermined composition on the substrate. It is difficult to prepare an alloy target of a high melting point metal (refractory metal) of a predetermined composition and with a high purity of over 99.99%. For example, refractory metals such as Mo, Ta, Wo, Cr, Nb, V, Zr, Tc, Ru, Rh, Hf, Ir, Os or Re and metallic Si are very hard to purify, and refractory metal silicide sputtering target plate such as $MoSi_2$, $TaSi_2$ with a higher purities than 99.99% are much harder to be prepared. Refractory metal and Si are separately arranged so as to make one target plate of the sputtering electrode structure and a composite film (for example, Mo+Si, Ta+Si, Zr+Si, Cr+Si, Wo+Si, Pt+Si, Pd+Si, Rh+Si, Ir+Si) is formed by the sputtering technique. The target plate for a composite film of polyimide+polytetrafluoroethylene is prepared as well.

In accordance with one aspect of the present invention, based on the fact that when lines of magnetic force are emanated from one source of magnetic force, they do not cross over themselves in nature, and attractive forces or expell forces by Maxwell forces act among the lines of magnetic force, a single source of magnetic flux forming a closed circuit having a plurality of magnetic poles is provided and the lines of magnetic forces emanated from some of the magnetic poles are controlled to shift the distribution of the lines of magnetic force emanated from the remainder of the magnetic poles so that the plasma position is shifted. In addition, two or more areas of different sputter materials are provided on the target plate by controlling the position of the plasma so that a composite film of any desired composition can be formed by the planar magnetron sputtering technique.

In a MOS type semiconductor memory device, since a poly-Si layer presents a high resistance, a high operation speed cannot be attained. It has been proposed to form a metal layer which is of low resistance on the poly-Si layer, but it needs a heat treatment of around 1000° C. in an impurity diffusion process for about an hour, during which the metal layer is molten. If refractory metal (high melting point metal) silicide layer can be formed on the poly-Si layer, the resistance of the metallurgy at a gate can be reduced and hence the MOS type semiconductor memory device having a significantly improved operation speed can be attained.

On the other hand, it is difficult to refine the high melting point metal or refractory metal because of its high melting point, as a matter of course, and hence it is more difficult to prepare a practical target material of refactory metal silicides with a high purity, with (intermetallic compound of silicon), for example, a purity of 99.999% which is normally required for the semiconductor devices. Thus, this has been a great neck in the gate metallization process of the MOS type semiconductor memcry device which uses the refractory metal silicides.

A $MoSi_2$ alloy target is prepared normally by a hot press technique (in which particles are compression-molded under a high temperature) because it is difficult to refine by vacuum melting process. Since binder material is used to accelerate the joining of the $MoSi_2$ particles in the process, a purity is reduced. In addition a high porocity in the target plate prepared by the hot press technique results so that the target plate tends to contain much greater vapor and that the deposited film property is deteriorated. In accordance with the present invention, the above problems are resolved and the MOS type IC memory devices having a significantly improved operation speed are provided.

The present invention will be better understood from the following description with reference to the accompanied drawings in which:

FIG. 1 shows a schematic diagram for illustrating a prior art co-sputtering device, FIG. 2 shows a schematic sectional view of a co-sputtering planar magnetron sputter electrode structure in accordance with one embodiment of the film forming method of the present invention, FIG. 3 shows a sectional view of another embodiment, FIG. 4 shows a sectional view of a further embodiment, FIG. 5 shows a schematic sectional view of a co-sputtering planar magnetron sputter electrode structure having double magnetic poles and coils, FIG. 6 shows a power supply used for the electrode structure shown in FIG. 5, FIG. 7 shows a magnetic field distribution of the co-sputtering planar magnetron shown in FIG. 5, FIG. 8 shows a magnetic field distribution similar to that shown in FIG. 7, FIG. 9 shows a chart for explaining a correlation between a plasma ring diameter and a film deposition distribution, FIG. 10 shows a conceptual view for explaining a combination of the film thickness distribution by the co-sputtering planar magnetron sputter electrode structure of the present invention, FIG. 11 shows a basic film formation characteristic of the co-sputtering planar magnetron sputter electrode structure of the present invention, FIGS. 12, 13 and 14 show basic film formation characteristics similar to that shown in FIG. 11, FIG. 15 shows a diagram for illustrating a positional relationship between a target plate of the present invention and a plasma ring diameter, FIGS. 16 and 17 show constituent distribution characteristics of molybdenum-silicide alloy films of the present invention, FIGS. 18 and 19 show a control method for exciting currents, FIG. 20 shows a constituent distribution characteristic of a molybdenum-silicide alloy film formed by the control method shown in FIG. 19, FIGS. 21, 22 and 23 show target plates having different materials arranged thereon, and FIG. 24 shows a partial sectional view of a MOS type IC memory.

FIG. 2 shows a schematic sectional view of a planar magnetron type sputtering electrode of the present invention. Arranged on a back side of a target material plate (hereinafter referred to as a target plate) 21 having a plurality of materials 21a and 21b arranged thereon, are a ring-shaped magnetic pole 23 magnetically coupled by a yoke 22 and a cylindrical magnetic pole 24 at the center of the ring-shaped magnetic pole 23, to form a magnetic circuit. By those magnetic poles 23 and 24, a distribution of lines of magnetic force or a semi-torus magnetic field distribution 25 usually called a tunnel-like magnetic field distribution, which is bisected by a plane normal to the height of the torus with the bisecting plane being parallel to the surface of the target plate 21, is created. By the tunnel-like magnetic field distribution 25, ring-shaped plasma region 30 are confined therein at a high density. The ions in the plasma region are accelerated by an electric field (not shown) which is created by a high voltage supplied by a high voltage power supply Vs between an anode 26 and a cathode body 27 on the back side or magnetic pole side of the target plate 21 which is in electrical contact with cathode body 27 the electric field is substantially normal to the surface of the target plate 21. The ions are accelerated and bombard the principal plane surface of the target plate 21. As a result, atoms or particles are sequentially sputtered out of the surface of the target plate 21 so that an erosion area 28 is formed. As will be seen from the following explanation, the erosion proceeds as the sputtering process proceeds. For the target plate structure shown in FIG. 2, the erosion normally proceeds in a limited area of the target plate 21. The erosion area is created at a point or area in which the line of magnetic force is parallel to the target plate. Numeral 29 denotes an insulating plate, numeral 31 denotes an inlet/outlet pipe for cooling medium (e.g. water) for the target plate 21, numeral 32 denotes a sealing O-ring, and numeral 33 denotes an insulating bushing for electrically insulating the anode 26 and the cathode 27.

In FIGS. 2 to 5, numeral 80 denotes a substrate holder for holding the substrate 10, numeral 81 denotes a heat sealed chamber for shielding the heat flux from the heater 64 from the elements other than the substrate 10, and numeral 82 denotes a water cooling pipe connected to the heat shield wall 81 for cooling the heat shield wall 81.

The sputter electrode structure of the present invention is now explained. The magnetic poles 23 and 24 are arranged to create the lines of magnetic force 25 such that the plasma 30a is generated across over the border of the two materials of the target plate 21 which comprises the target 21a made of the material A and the target 21b made of the material B so that the two materials are simultaneously sputtered. As a result, a composite film such as an alloy film consisting of the materials A and B from the erosion area 28a of the target plate 21 is formed on the substrate 10.

It is required to design the distribution of the magnetic field in front of the target plate so as to locate the plasma ring region just acrossing over the border of the two target material so that a film with a predetermined composition is obtained. While FIG. 2 shows the planar D.C. magnetron type sputter film forming device, a conventional diode type sputter film forming device having no magnets behind the target plate may be used to form the composite film (e.g. alloy film) as shown in FIG. 4. When the conventional diode type sputter film forming device is used, since the plasma region is not confined by the magnetic field as in the case of the planar magnetron sputtering cathode and the plasma region is generated over entire area of the target plate, it is ready to provide an area 21c of a material C in addition to the area 21a of the material A and the area 21b of the material B on the target plate 21 as shown in FIG. 4 so that an alloy film consisting of three materials is formed on the substrate 10. It is also ready to form a composite film consisting of more than three materials.

FIG. 5 shows a schematic sectional view of another embodiment of the sputter electrode structure of the present invention. It comprises; a target plate 21 having a circular target plate 21a and ring target plates 21b and 21c, a copper backing plate 35 which is in electrical contact with the target plates 21a, 21b and 21c and connected to the high voltage power supply and to which the target plate 21 is normally fixed by brazing, a substrate 10 in a stationary position disposed parallelly and in oppositely to the target plate 21, magnetic poles 36, 37 and 38 for creating magnetic fields for a planar magnetron sputter electrode structure in a space between the substrate 10 and the target plate 21, an inner exciting coil 39 and an outer exciting coil 40 for exciting the magnetic poles 36, 37 and 38, a yoke 41 which forms a single magnetic flux generating source together with the coils 39 and 40 and the magnetic poles 36, 37 and 38, connecting terminals 42 for the inner exciting coils, connecting terminals 43 for the outer exciting coil, an insulating member 45 for insulating the sputter electrode from a vacuum chamber 44, a vacuum sealing O-ring 46, a connecting terminal 47 extended from an electrode body 49 which is electrically connected to a backing plate 35 which is in electrical contact with target plate 21, and a grounded anode 48 which acts as an anode of the sputter electrode structure and suppresses unnecessary discharge which would otherwise take place in the edge of the target plate 21.

As described above, the target plate 21 includes the first circular member 21a, the second ring target member 21b which circles the member 21a and the third ring target member 21c which circles the member 21b. In the present embodiment the first target member 21a is made of Si, the second ring target member 21b is made of Mo and the third ring target member 21c is made of Si. Those three target members are concentrically arranged.

In the embodiment shown in FIG. 5, the target plate 2 is circular because the substrate used in the present embodiment is circular. When a rectangular substrate is used, it will be appropriate to prepare a rectangular target plate. The circular electrode structure shown in the present embodiment is a mere example and the electrode of other shape such as rectangle is within the scope of the present invention.

A passage (not shown) for passing coolant such as water is formed on the back side of the backing plate 35 and pipes 31 for supplying and exhausting the coolant through the magnetic field generating yoke 41 are connected to the passage to cool the target plate 21.

FIG. 6 shows a schematic configuration of an exciting power supply for the present electrode structure. It comprises two sets of current supply circuits in order to completely and separately control the inner solenoid coil 39 and the outer solenoid coil 40. The exciting power supply uses a microprocessor 51 and a memory 52 to allow setting of a constant current which does not change in time or a current waveform such as a square wave, a ramp wave or an A.C. wave having a predetermined fixed period, as the currents to be supplied to the inner and outer exciting coils 39 and 40. Information for a desired one of the current waveform is entered from a keyboard 53 or an appropriate external storage system 50 (e.g. magnetic tape or magnetic disc) and an output of the microprocessor 51 is supplied to digital-analog converters (hereafter D/A converters) 54a and 54b, and the outputs of the D/A converters are amplified by current amplifiers 55a and 55b to a sufficient intensity to excite the inner and outer solenoid coils 39 and 40, respectively.

Since the exciting power supply of FIG. 6 controls the inner and outer solenoid coils 39 and 40 with its constant current characteristic and has a feedback circuit for detecting the solenoid currents by current detectors 56a and 56b, differential amplifiers 55a, 55b compare the detected current values with the reference current values provided by the D/A converters in order to correct the current values in the two solenoids to the values provided by D/A convertors.

A high voltage power supply or a sputter power supply for supplying a discharging power for the sputtering may be one which supplies an output voltage of approximately 0-4000 volts and an output current of approximately 0-15A, as has been well known in the past. The high voltage power supply is recommended to have a constant current output characteristic to enhance the control ability of a power supplied to a glow discharge in the case of the planar magnetron sputtering, as is well known.

As described above, the erosion area at which the sputtering takes place on the target plate localized substantially directly below the area at which the plasma ring is created in the case of the planar magnetron sputtering. Under the sputtering pressure of 1-10 m Torr which is used in the normal planar magnetron sputtering, the plasma region is concentrated in a ring shaped area which is in a space above the first principal surface, on the opposite side of the backing plate, of the target plate and spaced from the first major principal plane surface by 0-20 mm and in which the magnetic field vector is parallel to the first principal surface of the target plate.

Accordingly, it is an effective way to detect a magnetic flux distribution in the space above the first principal plane surface of the target plate in order to predict or to determine the position of the erosion area formed on the target plate.

Accordingly, before measuring the characteristics such as the film thickness distribution of the film formed by the sputter electrode structure of the present embodiment, the magnetic flux distribution in the space above the first principal plane surface of the target plate 21 was measured. A gauss meter was used to measure the magnetic flux distribution.

FIGS. 7 and 8 show results of the measurement for a magnetic flux generating means prepared in a substantially same size as the embodiment of FIG. 5 n order to similate the magnetic flux distribution above the first principal plane surface of the target plate 21 of the sputter electrode structure of the present embodiment. A difference between the embodiment of FIG. 5 and the prepared magnetic flux generating means is that grooves in which the inner and outer solenoid coils 39 and 40 in FIG. 5 are embedded are shallow in the prepared magnetic flux generating means.

Ordinates in FIGS. 7 and 8 represent a height (in mm) from the lower end of magnetic poles 36, 37 and 38 and abscissas represent an externally radial distance (in mm) from the center axis of the sputter electrode structure shown in FIG. 5, that is, the center axis of the magnetic pole 36. In FIG. 7, a ratio of the magneto-motive force in the inner solenoid coil 39 to that in the outer solenoid coil 40 is 40. In FIG. 8, the ratio is 1.5. In FIGS. 7 and 8, the directions of the currents supplied in the inner coil 39 and the outer coil 40 are opposite to each other.

As described above, since the plasma ring is created in the area where the magnetic field vector is parallel to the first principal plane of the target plate 21, the plasma rings are considered to be created n areas denoted by numerals 48 and 49 shown in FIGS. 7 and 8.

Accordingly, as seen from FIGS. 7 and 8, the positions of the plasma rings can be shifted by varying the magneto-motive forces in the inner and outer solenoid coils 39 and 40, respectively.

In FIGS. 7 and 8, the magneto-motive force in the inner solenoid coil 39 was kept constant and the magneto-motive force in the outer solenoid coil 39 was changed from 1/40 to 1/1.5 of the magneto-motive force in the inner solenoid coil 39. Alternatively, the magneto-motive force in the outer solenoid coil 40 may be kept constant and the magneto-motive force in the inner solenoid coil 39 may be varied to shift the area where the magnetic field vector is parallel to the target plate 21.

Prior to the explanation of the present embodiment the electrode structure shown in FIG. 5, basic film thickness distributions on the substrate 10 obtained by the exciting power supply shown in FIG. 6 are now explained. First, it is assumed that the target plate 21 is not a triple ring structure but it is made of a single material.

FIG. 9 shows four calculated film thickness distributions on the substrate 10 mounted at a distance of 85 mm from the first principal plane surface of the target plate 21 in parallel to the first principal plane with four different diameters D (mm) of a ring-shaped erosion area 28 formed on the target plate 21. It explains a first technical concept of the present invention. An ordinate represents a relative film thickness in percent to the film thickness at the center of the substrate being 100% and an abscissa represents an outward radial distance (in mm) on the substrate from the center of the substrate.

As seen from FIG. 9, when the diameter D of the ring-shaped erosion area 28a is large, a so called twin-peak film thickness distribution having a shoulder at a radial distance of approximately 88 mm on the substrate is obtained. On the other hand, when the diameter D is smaller than 125 mm, the shoulder in the film thickness distribution disappears and a so-called single peak film thickness distribution having a peak at the center on the substrate is obtained.

From a practical point of view the deviations in film thickness distribution over the substrate should be smaller than a required range of deviation. This film thickness deviation over the substrate between ±5% and ±10% is acceptable depending on the case of application.

It can be seen that for a given value of the allowable deviation in the film thickness distribution there is an optimum erosion region diameter which provides a film over the widest area of the substrate within a range of the allowable deviation in film thickness distribution. The film thickness distributions with the erosion region diameters between $\phi$ 150 mm and $\phi$ 125 provide such a wide film thickness distribution. Hereafter their distributions providing flat distributions within the range of the allowable film thickness deviation over the substrate are referred to as the maximum available flat distribution.

While the above discussion has been made on the diameters D of the ring-shaped erosion area 28a, it may be considered that the diameter of the ring-shaped erosion area is a direct reflection of the diameter of the plasma ring because the erosion area is created substantially directly below the plasma ring as described above. Accordingly, by varying the diameter of the plasma ring by the controllability of the magnetic field distribution shown in FIGS. 7 and 8, it is expected that various film thickness distribution characteristics as shown in FIG. 9 can be obtained.

A curve 61 shown in FIG. 10 is a conceptual chart of the film thickness distribution which is expected to be obtained when currents of opposite polarities are supplied to the inner solenoid coil 39 and the outer solenoid coil 40 shown in FIG. 5 with the ratio of the magneto-motive force in the outer solenoid coil 40 to that in the inner solenoid coil 39 being 1/40. A curve 62 shown in FIG. 10 is a conceptual chart of the film thickness distribution which is expected to be obtained when the ratio of the magneto-motive force in the inner solenoid coil 39 to that in the outer solenoid coil 40 is 1.5 to reduce the diameter of the plasma ring.

By varying the electro-motive forces of the inner and outer solenoid coils during the formation of the film on one substrate in order to appropriately provide the film thickness distributions as shown by 61 and 62 in FIG. 10, a uniform film thickness distribution over a wide area on the substrate as shown by a curve 63 in FIG. 10 which is a combined characteristic of the curves 61 and 62 can be obtained on the substrate.

FIGS. 11, 12, 13 and 14 show basic characteristics of the present embodiment, that is, the film thickness distributions on the substrate 10 when the target plate is made of a single material.

FIGS. 11 through 14 show the actual film thickness distributions when the distance between the target plate 21 and the substrate 10 is 73 mm, the target material is Al-2% Si (purity 99.999%), and the sputter gas is Ar (purity 99.999%) at 5.4 m Torr.

The exciting conditions in the solenoid coils 39 and 40 are as follows: The current in the outer solenoid coil 40 is first set to be zero and the current in the inner solenoid coil 39 is adjusted such that a magnetic flux density of approximately 200 Gauss is obtained at a distance of 15 mm above the first principal plane of the target plate 21. Thereafter, a current determined according to experimentary conditions is supplied to the outer solenoid coil 40 in the opposite direction to the current in the inner solenoid coil 39.

FIG. 11 shows the film thickness distribution obtained when the current is supplied to the outer solenoid coil 40 such that the diameter of the plasma ring of approximately 94 mm is obtained. The diameter of the plasma ring is determined by measuring the erosion area 28a by surface roughness meter after the film forming experiment.

Figure 11:
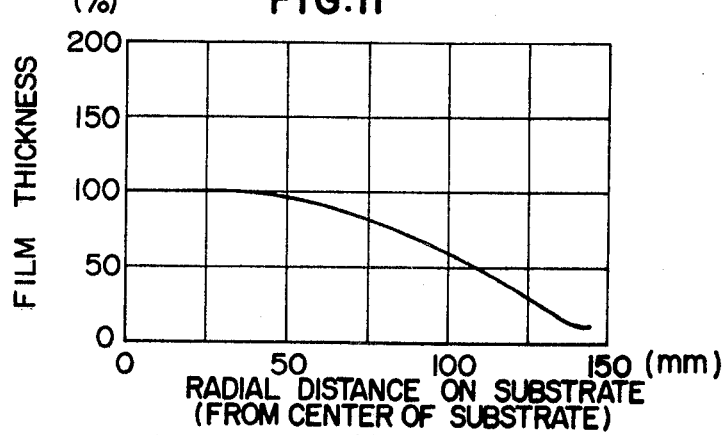
Figure 12:
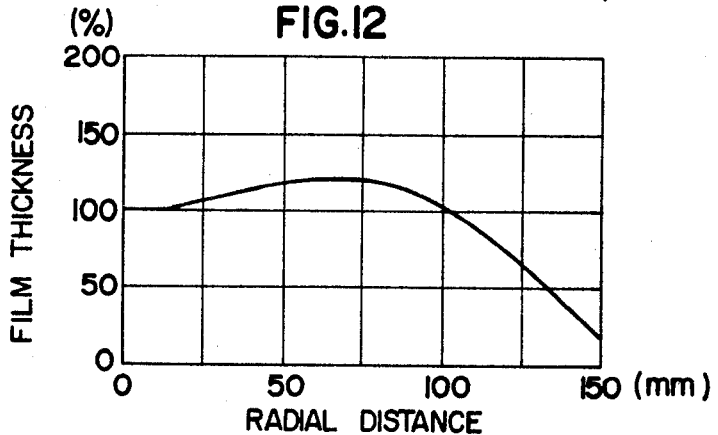
FIG. 12 shows the film thickness distribution obtained when the plasma ring diameter is 150 mm.
Figure 13:
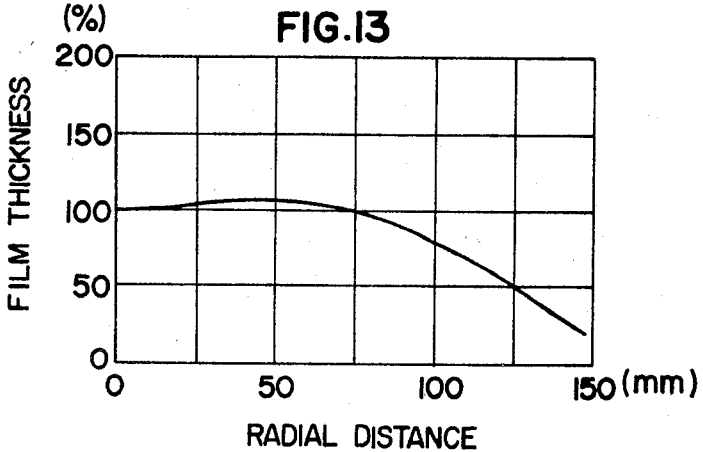
FIG. 13 shows the film thickness distribution obtained when the plasma ring diameter is 122 mm.

As seen from FIGS. 11 to 13, when the distance between the target plate and the substrate is 75 mm and the plasma ring diameter is set to be approximately 122 mm, the film thickness distribution is uniform over the widest area.

Figure 10:
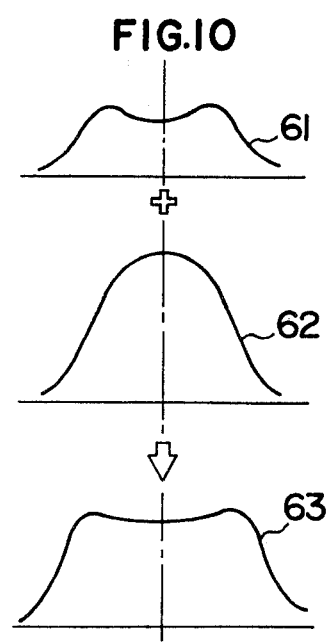
Figure 14:
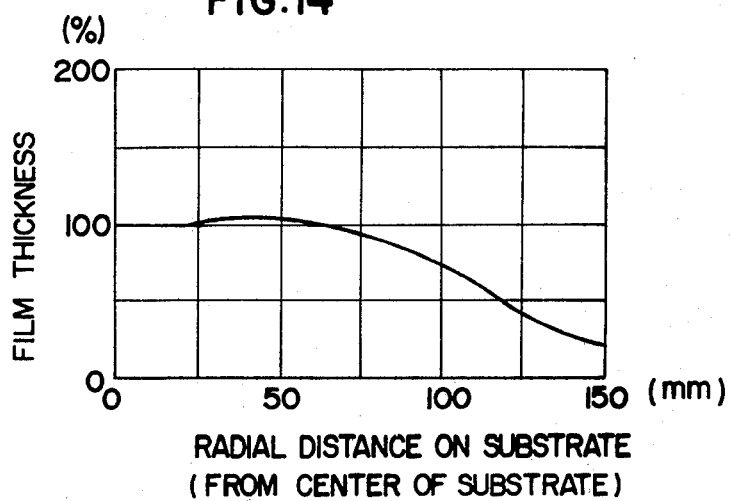

FIG. 14 shows the film thickness distribution obtained when the plasma ring diameter is set to 94 mm for eight seconds and then the plasma ring diameter is set to 150 mm for eleven seconds, and the above cycle is repeated five times to form the film of approximately one μm. It exhibits a wide film thickness distribution similar to that of FIG. 13 which is obtained when the plasma ring diameter is 122 mm. Thus, a similar wide film thickness distribution to that obtained when the plasma ring diameter is optimized, for example, 122 mm can be obtained by combining the film thickness distributions obtained by the plasma ring diameters of 94 mm and 150 mm, and this experimental result shows that the technical concept shown in FIG. 10 is actually realized.

Figure 15:
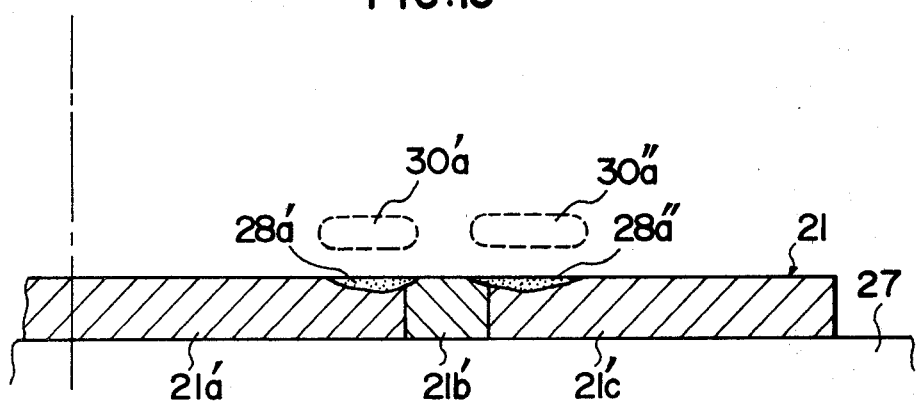

The three-fold ring target shown in FIG. 5 is now discussed. FIG. 15 schematically shows a positional relationship between the three-fold ring target and the plasma rings having the diameters of 94 mm 30a' and 150 mm 30a''. The plasma rings 30' and 30a'' have definite width and hence the erosion areas 28a' and 28a'' are created.

One of the most significant effects of the present invention is now explained. FIG. 16 shows a composition distribution of a film formed by the three-fold ring target shown in FIG. 15 which is made of Mo target 21b' and Si targets 21a' and 21c'. The condition of the plasma ring diameter in FIG. 16 is same as that of FIG. 14. That is, the plasma ring diameter is set to 94 mm for eight seconds and it is set to 150 mm for eleven seconds, and the above cycle is repeated five times while the sputtering power supplied by the high voltage power supply is kept to be constant.

An ordinate in FIG. 16 represents the film composition in percent with the Si composition in atomic percent at the center of the substrate being normalized to be 100%. Mo is represented by an atomic percent relative to the Si composition at the center of the substrate. The constituent distribution was measured by an energy scatter type X-ray analyzer. The constituent distribution of Mo/Si - ½ was observed within a deviation of ±5% over an area of 140 mm diameter on the substrate.

The Mo and Si layers are deposited in the form of thin layer structure, and the deposited film at this stage is not a true Mo-Si alloy film. Thus, the film is heat-treated in an Ar or $N_2$ environment at 1000° C. for one hour. As a result, the film is alloyed and the layer structure is not able to be detected by an available Ion Micro Analyzer.

Figure 24:
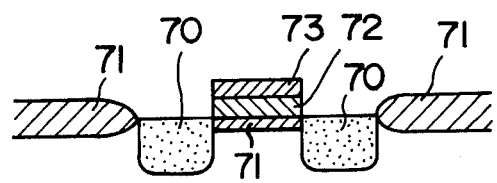

FIG. 24 shows a partial sectional view of a MOS type IC memory. Numeral 70 denotes an ion implanted inpurity-doped region, numeral 71 denotes an $SiO_2$ layer and numeral 72 denotes a poly-Si layer. If the gate metallization is made only by the poly Si layer 72, a resistance thereof is high and hence the operation speed of the MOS type IC memory cannot be improved. The Mo-$Si_2$ alloy film 73 described above of the thickness of 3000Å might be formed on the poly-Si layer 72 and it remains unmolten during the heat treatment in the impurity diffusion process. Accordingly, a high quality of Mo-$Si_2$ alloy film 73 can be formed and the MOS type IC memory having an improved operation speed and a high reliability can be provided.

In the experiment made by the inventors, the Mo-$Si_2$ thin film structure immediately after the formation raised no process problem if each layer thickness of the Mo-Si layers is below approximately 500 Å. When the Mo-$Si_2$ film of 3000 Å thickness is desired, it will be sufficient that the above cycle is repeated about ten times during one deposition process for a substrate.

Another significant effect of the present invention is now discussed. FIG. 17 shows constituent distributions of Mo and Si when the film is formed by varying plasma ring diameter between 80 mm and 164 mm. The plasma ring diameter is set to 80 mm for four seconds and then it is set to 164 mm for 6.5 seconds, and the above cycle is repeated for four times to form the film on the substrate 10. As a result, the constituent distribution of Si/Mo=100/9.6 (in atomic percent) is obtained over an area of 150 mm diameter on the substrate 10. It is important to note that the constituent distribution of the resulting film can be selected freely while maintaining it constant over a sufficiently wide area by controlling the plasma ring diameter. In the present embodiment, the composition can be controlled by selecting the current waveform supplied to the outer solenoid coil. This is a new and very effective freedom which has not been presented by the conventional magnetron sputtering electrode structure.

Figure 18:
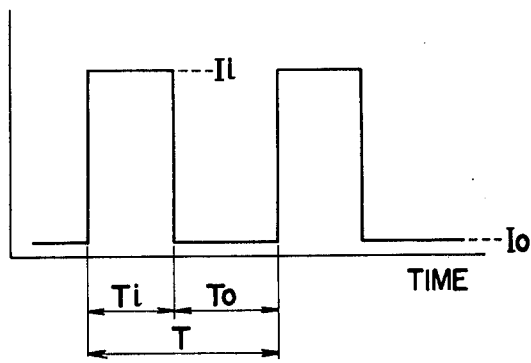

FIG. 18 shows a current waveform supplied to the outer solenoid coil 40 to obtain the film thickness distributions shown in FIGS. 16 and 17. T denotes one cycle period of the change of the plasma ring diameter. In FIG. 16, T is 19 seconds and in FIG. 17 it is 10.5 seconds. The cyclic period is expressed as $T=T_o+T_i$, where $T_o$ is a period in which the plasma ring diameter is large and $T_i$ is a period in which the plasma ring diameter is small. In FIG. 16, $T_i$ is 8 seconds, $T_o$ is 11 seconds, and in FIG. 17, $T_i$ is 4 seconds and $T_o$ is 6.5 seconds.

While the current waveform in the outer solenoid coil 40 is rectangular in FIG. 18, it may be a ramp wave or a sine wave and the film thickness distributions as shown in FIGS. 16 and 17 can be obtained by appropriately selecting the amplitude and the phase of the current waveform.

Figure 19:
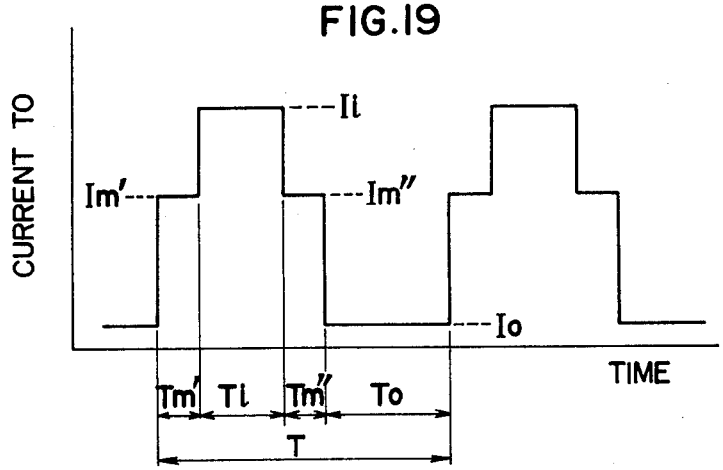

FIG. 19 shows a stepwise current waveform supplied to the outer solenoid coil 40 to form the film. The wave assumes current magnitudes of $I_m'$ ($I_o < I_m' < I_i$) for $T_m'$, $I_i$ for $T_i$, $I_m''$ ($I_o < I_m'' < I_i$) for $T_m'$ and $I_o$ for $T_o$. For the period of $T_m' + T_m' = T_m$, the plasma ring diameter is larger than the plasma ring diameter defined by $I_i$ and smaller than that defined by $I_o$. It is not necessary that $T_m' = T_m''$ or $I_m' = I_m''$.

Figure 9:
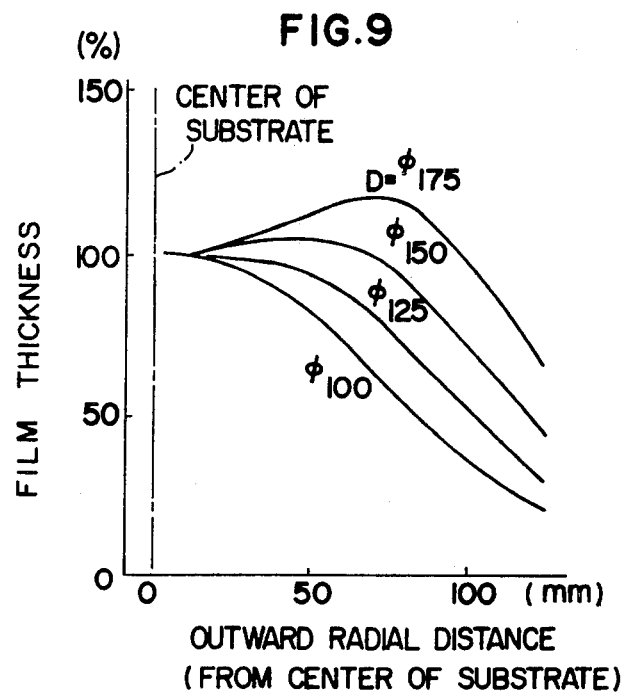
Figure 20:
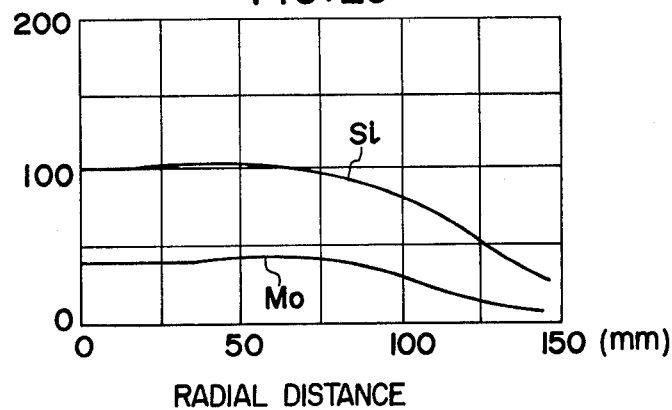

The film was formed using the stepwise waveform shown in FIG. 19 under the conditions of $T_i = 4$ seconds. $T_m(=T_m'+T_m'')=2$ seconds, $T_o=6.5$ seconds $I_m'=I_m''$ and $I < I_m < I_i$. The currents $I_i$ and $I_o$ of FIG. 19 are selected such that the condition is same as that of FIG. 17 if $T_m$ is zero second. The current $I_m$ is selected such that the plasma ring is located just above the ring-shaped Mo target members 21b and 21b' shown in FIGS. 5 and 15. The resulting film constituent distribution is shown in FIG. 20. The film constituent distribution shown in FIG. 20 has the same Si characteristic shown in FIG. 17 and an increased Mo atomic percent characteristic. This means that the composition can be controlled by setting th = plasma ring diameter to an intermediate value between a maximum and a minimum within one cycle of the film formation. This second composition control method has been introduced from the learning that the film thickness distribution is not significantly disturbed even if a plasma ring diameter which provides the maximally available flat distribution over the widest area such as shown in FIG. 9 is introduced in the control cycles of the plasma ring.

By developing the above concept, any plasma ring diameters around the above-mentioned intermediate plasma ring diameter which provides the maximally available that distribution may be combined as described along with FIG. 14, so that a similar film constituent distribution to that obtainable by the plasma ring diameter which provides that a flat film constituent distribution over the widest area can be obtained. Accordingly, the waveform for controlling the composition need not be the stepwise waveform but it may be a ramp wave or a continuous sine wave.

While the composition control has been described with respect to the current waveform in the outer solenoid coil 40, the current in the outer solenoid coil 40 may be fixed and the current in the inner solenoid coil 39 may be similarly controlled, as described above. Both the currents in the inner and outer solenoid coils may be simultaneously controlled, but this is not deposed from the technical concept of the composition control described above.

While the composition control method has been described with respect to the currents in the inner and outer coils, the sputtering power may be controlled simultaneously with the currents in the outer and inner coils. In the sputtering technique it is well known that the film formation speed is simply proportional to the sputtering power. So one can determine a film thickness required by predetermining the sputtering power assuming that the film formation time is given. Therefore time periods such as Ti and To in FIG. 19, Ti, To, Tm', and Tm" can be changed approximately so as to have a required constituent distribution of the film if the sputtering power is, preferably, synchronously controlled together with one or both of the currents in the outer and inner coils.

This controlling method including the sputtering power control to have a required constituent distribution of the film over the substrate is within the scope of the present invention.

Figure 23A:
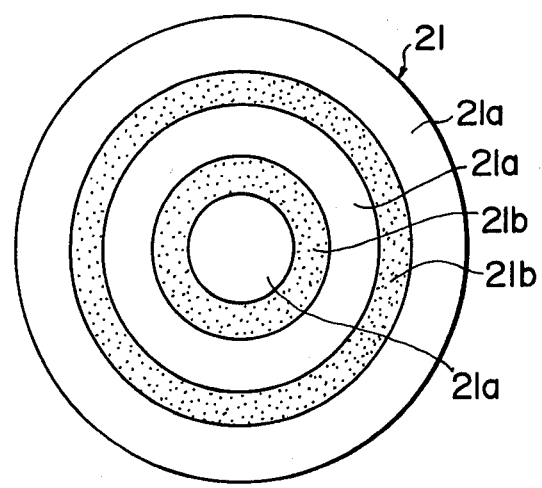
Figure 23B:

When the target plate 21 is made of a composite material of the material A and the material B of a predetermined composition, the composite film can be formed on the substrate 10 disposed oppositely to the target plate 21, but it is difficult to form a composite film of a high melting point metal (for example, Mo, Ta, Wo, Si, Cr, Nb, V, Zr, Tc, Ru, Rh, Hf, Ir, Os, Re) and other metal, for example, composite film of Mo+Si, Ta+Si, Zr+Si, Cr+Si, Wo+Si, Pt+Si, Pd+Si, Rh+Si, Ir+Si, or a composite film of an organic material and a metal, for example, polyimid+polytetrafluoroethylene because the material of alloys and organic composites are hard to obtain as a sputtering target with a sufficiently high purity of normally over 99.999%. When the material A 21a and the material B 21b are arranged as shown in FIG. 21, 22 or 23 to use as the target plate 21 and they are sputtered by the sputtering apparatus described above, a composite film having a desired composition can be formed on the substrate 10.

For example, the material 21a shown in FIG. 21 or 22 is Si and the material 21b is Mo, Ta, Zr, Cr, Wo, Pt, Pd, Rh or Ir.

In addition when the sputtering apparatus having the double magnetron electrode structure as shown in FIG. 5 is used and the position of the plasma ring is magnetically shifted to control the termination time, a composite film (alloy film) having almost any desired composition can be formed. As described hereinabove in accordance with the present invention, a composite film of a predetermined composition of a plurality of materials can be formed by arranging the stationary substrate oppositely to the planar magnetron sputtering electrode. Thus, an excellent co-sputtered film which could not be attainable by the prior art can be provided.

Figure 1:
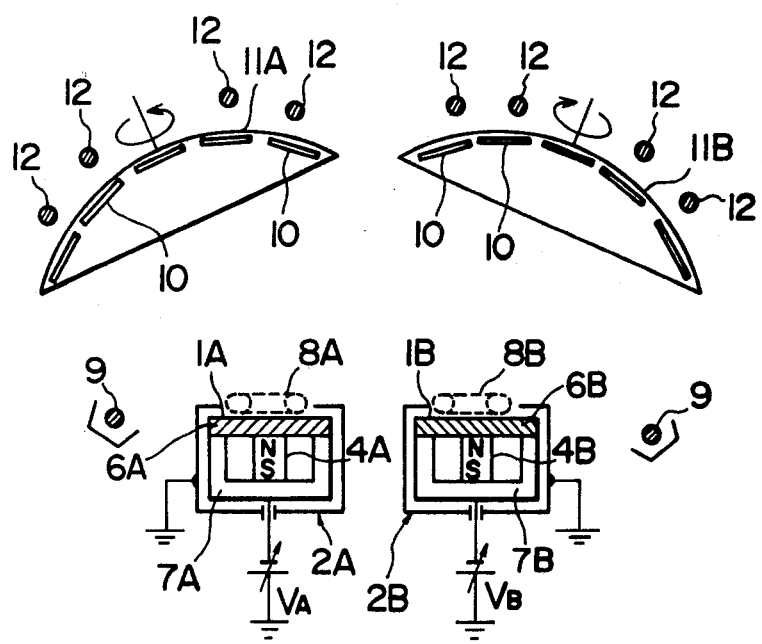
Figure 6:
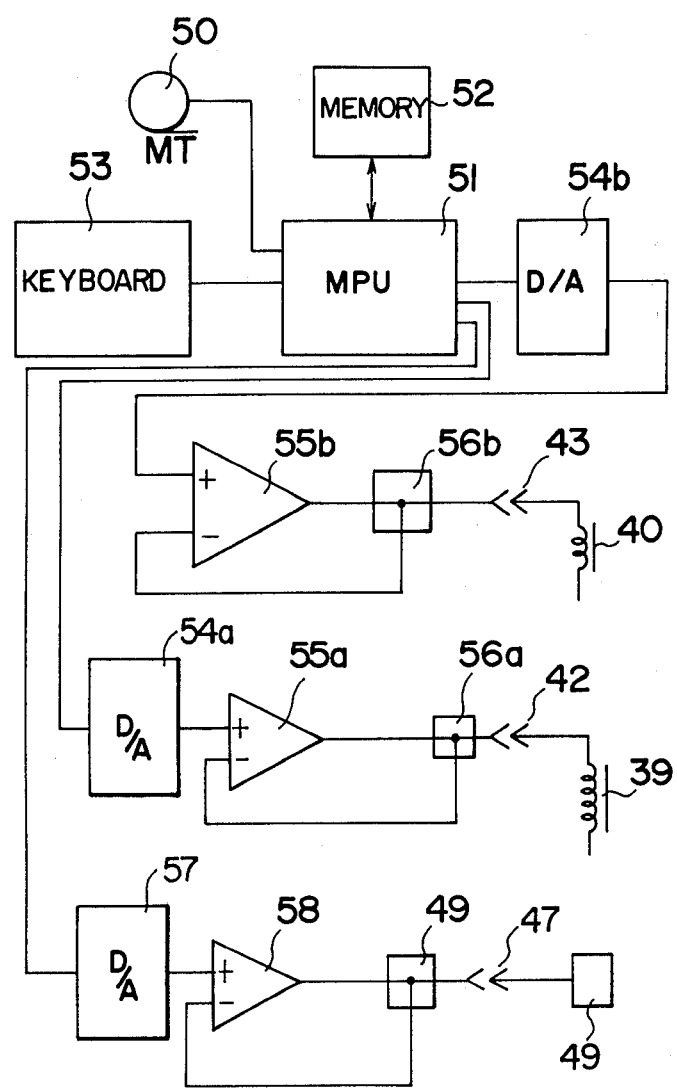
Figure 7:
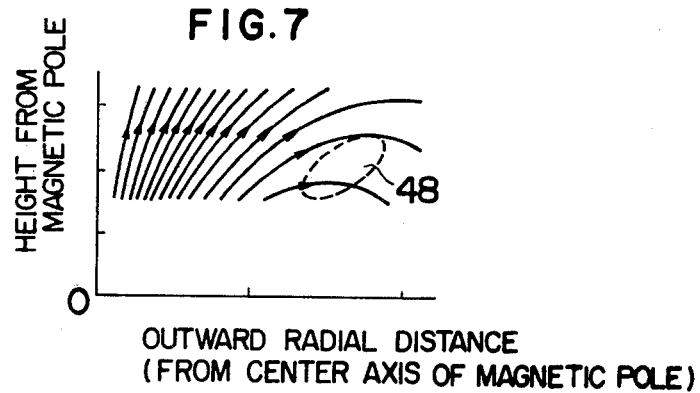
Figure 8:
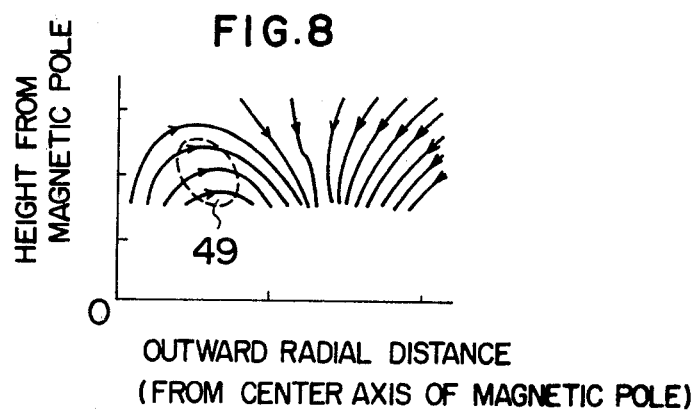

Under the condition for obtaining the constituent distribution shown in FIG. 16, the film forming rate was 1000 Å/minute for the substrate of 125 mm diameter and under 420 V×4 A of the sputtering power. This rate is about ten times as high as the rate attainable in the prior art co-sputtering technique, for example, by the apparatus shown in FIG. 1. Oxygen is observed by the measurement by an Ion Micro Analyzer in the films prepared by the prior art method, but the amount of the peak in the $MoSi_2$ film formed by the co-sputtering electrode of the present invention under the condition of FIG. 16 is about one fourth of that of the film formed by the prior art apparatus. This tells us that the content of the residual impurity gas described above is reduced by the high film formation rate. Such an excellent process condition can be attained because the sputtering electrode structure and the film forming method of the present invention permit the co-sputtering with a single electrode structure.

In accordance with the present invention, since the co-sputtering is attained while the substrate 10 is kept stationary, the heater 64 to heat the substrate 10 can be disposed in contact to or very closely to the substrate 10, as shown in FIGS. 2 to 5.

The heating system is required to heat only a single substrate, therefore the heat flux can be confined in a smaller area. Thus, the substrate 10 can be readily heated up to 300° C. or higher without raising the temperatures of the objects in the vacuum chamber.

If the mechanical elements or vacuum chamber walls are heated, they release gases such as $H_2O$, $O_2$ or $N_2$ etc. which are normally absorbed on the surfaces of the mechanical elements and the vacuum chamber.

These released gases increase the residual gas pressure other than the sputtering gas of Ar in the vacuum chamber. These gases are contained in the film during the film formation and tend to deteriorate the film property.

Therefore, the heat flux confinement is provided by a planar magnetron sputtering electrode of the present invention and the resultant film forming method is achieved with the substrate being stationary.

We claim:

1. A film forming method for forming a film on a substrate comprising the steps of:
    preparing a target plate having at least a center region and a second region around said center region of different materials, and
    forming a plasma above said target plate for sputtering said materials out of said target plate and depositing onto said substrate, and
    controlling excitation current flowing in a solenoid to shift said plasma across a boundary between said two regions in a planar magnetron sputtering structure whereby said film is provided with desired composition of said materials.

2. A film forming method according to claim 1 further comprising a step of heat-treating to form said film of an alloy.

3. A film forming method according to claim 2 wherein said materials include a refractory metal and a Si material and said alloy film is a refractory metal silicide film.

4. A film forming method according to claim 3 wherein said center and second regions are concentric in said target plate.

5. A method for forming a refractory metal alloy film on a substrate comprising the steps of:
    reciprocatingly shifting a plasma to cross a plurality of metal regions of a refractory metal material and other material in a target by controlling excitation current flowing in a solenoid of a planar magnetron sputtering electrode structure to alternately deposit a refractory material layer and other material layer on the substrate, and
    heat-treating said substrate to change said refractory and other material layers into said refractory metal alloy film.

6. A method for forming a refractory metal alloy film according to claim 5, wherein said other metal material is Si.

7. A method for forming a refractory metal alloy film according to claim 6, wherein said refractory material is any one of Mo, Ta, Wo, Cr, Nb, V, Zr, Tc, Ru, Rh, Hf, Ir, Os and Re.

8. A method for forming a refractory metal alloy film accoridng to claim 7, wherein said refractory metal alloy film is refractory metal silicide.

9. A method of forming a film in a planar magnetron sputtering apparatus provided with at least two magnetic field generating means, including at least one solenoid to be energized by a controlled current source, means for magnetically coupling said at least two magnetic field generating means to form an integrated magnetic flux source together with said at least two magnetic field generating means, including a magnetic member bridging said at least two magnetic field generating means and formed of a soft magnetic material, and said at least two magnetic field generating means being disposed on one side of the magnetic coupling means, and means for supplying a controlled current to said at least one solenoid for generating controlled magnetic flux so as to control a ring-like shaped plasma confined in said integrated magnetic flux at least in the neighborhood of said integrated magnetic flux source, said method comprising the steps of:
    preparing a target plate having a center region of a first material and a second region of a second material around said center region,
    flowing first exciting current in said solenoid to magnetically shift said plasma to a first position substantially above said center region for sputtering mainly said first material,
    flowing second exciting current in said solenoid to shift said plasma to a second position substantially above said second region for sputtering mainly said second material whereby said film is provided with alternate layers of mixture of said materials and said film is formed of desired composition of said materials after a heat-treatment.

10. A method of forming a film in a planar magnetron sputtering apparatus according to claim 9, wherein said first and second materials are silicon and refractory metal.

11. A method of forming a film in a planar magnetron sputtering apparatus according to claim 10, wherein a thickness of each of said two layers of the materials deposited alternately is below 500A.

12. A method of forming a film in a planar magnetron sputtering apparatus according to claim 11, further comprising a step of heat-treating said film to change said layers into refractory metal silicide.

13. A film forming method for forming a film on a substrate in a planar magnetron sputtering apparatus provided with at least two magnetic field generating means, including at least one solenoid to be energized by a controlled current source, means for magnetically coupling said at least two magnetic field generating means to form an integrated magnetic flux source together with said at least two magnetic field generating means including a magnetic member bridging said at least two magnetic field generating means and formed of a soft magnetic material, and said at least two magnetic field generating means being disposed on one side of the magnetic coupling means, and means for supplying a controlled current to said at least one solenoid for generating controlled magnetic flux so as to control a plasma confined in said integrated magnetic flux at least in the neighborhood of said integrated magnetic flux source, said method comprising the steps of:

preparing a target plate having a center, a second and a third region, each of which being arranged concentrically in the order thereof, said second region being made of a material different from that of the other regions, flowing first exciting current in said solenoid to magnetically shift said plasma to a first position substantially above said center region for sputtering mainly said first material, flowing second exciting current in said solenoid to shift said plasma to a second position substantially above said second region for sputtering mainly said second material, and flowing third exciting current in said solenoid to shift said plasma to a position substantially above said third region for sputtering mainly said third material, whereby said substrate is provided with repetitive layers of said materials and said film has desired composition of said materials after a heat-treatment.

14. A film forming method according to claim 13 wherein said third material is same as said first material.

15. A film forming method for forming a film on a substrate in a planar magnetron sputtering apparatus provided with at least two magnetic field generating means, including at least one solenoid to be energized by a controlled current source, means for magnetically coupling said at least two magnetic field generating means to form an integrated magnetic flux source together with said at least two magnetic field generating means including a magnetic member bridging said at least two magnetic field generating means and formed of a soft material, and said at least two magnetic field generating means being disposed on one side of the magnetic coupling means, and means for supplying a controlled current to said at least one solenoid for generating controlled magnetic flux so as to control a plasma confined in said integrated magnetic flux at least in the neighborhood of said integrated magnetic flux source, said method comprising the steps of:

preparing a target plate having a center, a second and a third region, each of which being arranged concentrically in the order thereof, said center and third regions being formed of a first material, said second region being formed of a second material different from said first material, flowing a first exciting current in said solenoid to magnetically shift said plasma to a first position above a first boundary between said center and second regions for sputtering both of said two materials, and flowing second exciting current in said solenoid to shift said plasma to a second position above a second boundary between said second and third regions for sputtering both of said two materials, whereby said film is provided with a uniform thickness of said two materials.

16. A film forming method for forming a film on a substrate according to claim 3, wherein said first material is silicon and said second material is refractory metal including any one of Mo, Ta, Wo, Cr, Nb, V, Zr, Tc, Ru, Rh, Hf, Ir, Os and Re.

* * * * *